(12) United States Patent
Oh et al.

(10) Patent No.: US 11,509,049 B2
(45) Date of Patent: Nov. 22, 2022

(54) TOUCH SENSOR-ANTENNA MODULE AND DISPLAY DEVICE INCLUDING THE SAME

(71) Applicants: DONGWOO FINE-CHEM CO., LTD., Jeollabuk-do (KR); POSTECH RESEARCH AND BUSINESS DEVELOPMENT FOUNDATION, Gyeongsangbuk-do (KR)

(72) Inventors: Yun Seok Oh, Gyeonggi-do (KR); Jong Min Kim, Gyeonggi-do (KR); Dong Pil Park, Incheon (KR); Won Bin Hong, Seoul (KR)

(73) Assignees: DONGWOO FINE-CHEM CO., LTD., Jeollabuk-Do (KR); POSTECH RESEARCH AND BUSINESS DEVELOPMENT FOUNDATION, Gyeongsangbuk-Do (KR)

( * ) Notice: Subject to any disclaimer, the term of this patent is extended or adjusted under 35 U.S.C. 154(b) by 276 days.

(21) Appl. No.: 16/827,998

(22) Filed: Mar. 24, 2020

(65) Prior Publication Data
US 2020/0227819 A1 Jul. 16, 2020

Related U.S. Application Data

(63) Continuation of application No. PCT/KR2019/012450, filed on Sep. 25, 2019.

(30) Foreign Application Priority Data

Oct. 5, 2018 (KR) .......... 10-2018-0119061

(51) Int. Cl.
*H01Q 1/24* (2006.01)
*H01Q 9/04* (2006.01)
(Continued)

(52) U.S. Cl.
CPC ............ *H01Q 1/52* (2013.01); *G06F 3/0412* (2013.01); *H01Q 1/243* (2013.01);
(Continued)

(58) Field of Classification Search
CPC ........ H01Q 1/52; H01Q 1/243; H01Q 9/0421; H01Q 1/364; H01Q 9/0407; H01Q 1/22;
(Continued)

(56) References Cited

U.S. PATENT DOCUMENTS

| 2011/0298670 A1* | 12/2011 | Jung ...................... H01Q 1/243 343/702 |
| 2012/0105081 A1 | 5/2012 | Shaikh et al. |
| 2016/0188092 A1* | 6/2016 | Sebastian ............. H01Q 1/2258 345/174 |

(Continued)

FOREIGN PATENT DOCUMENTS

| JP | 2018-142872 A | 9/2018 |
| KR | 10-2003-0095557 A | 12/2003 |

(Continued)

*Primary Examiner* — Dimary S Lopez Cruz
*Assistant Examiner* — Michael M Bouizza
(74) *Attorney, Agent, or Firm* — The PL Law Group, PLLC

(57) ABSTRACT

A touch sensor-antenna module according to exemplary embodiments of the present invention includes a substrate layer, a touch sensor electrode layer disposed on a central portion of an upper surface of the substrate layer, and antenna patterns disposed on a peripheral portion of the upper surface of the substrate layer at the same level as that of the touch sensor electrode layer. Mutual interference between the touch sensor electrode layer and the antenna pattern may be reduced to improve signal reliability and process efficiency.

13 Claims, 5 Drawing Sheets

(51) Int. Cl.
  *H01Q 1/52* (2006.01)
  *G06F 3/041* (2006.01)
  *H04M 1/02* (2006.01)

(52) U.S. Cl.
  CPC ........ *H01Q 9/0421* (2013.01); *H04M 1/0266* (2013.01); *H04M 2201/38* (2013.01); *H04M 2250/22* (2013.01)

(58) Field of Classification Search
  CPC ............ H01Q 1/242; H01Q 1/38; H01Q 1/48; H01Q 1/50; G06F 3/0412; G06F 3/0443; G06F 3/0446; G06F 2203/04112; G06F 3/0416; G06F 3/044; G06F 3/041; H04M 1/0266; H04M 2201/38; H04M 2250/22; H04M 1/026; H05K 1/02; H05K 1/0218
  See application file for complete search history.

(56) References Cited

U.S. PATENT DOCUMENTS

2017/0083153 A1   3/2017   Yeh et al.
2019/0220123 A1*  7/2019   Kanaya .................. G06F 1/1626

FOREIGN PATENT DOCUMENTS

| KR | 10-2012-0003682 A | 1/2012 |
| KR | 10-2014-0016495 A | 2/2014 |
| KR | 10-2014-0092366 A | 7/2014 |
| KR | 10-2014-0100822 A | 8/2014 |
| KR | 10-2016-0118418 A | 10/2016 |
| KR | 10-1718016 B1 | 3/2017 |
| KR | 10-2018-0099234 A | 9/2018 |
| KR | 10-2018-0101064 A | 9/2018 |

* cited by examiner

TOUCH SENSOR-ANTENNA MODULE AND DISPLAY DEVICE INCLUDING THE SAME The present application is a continuation application to International Application No. PCT/KR2019/012450 with an International Filing Date of Sep. 25, 2019, which claims the benefit of Korean Patent Application No. 10-2018-0119061 filed on Oct. 5, 2018 at the Korean Intellectual Property Office, the disclosures of which are incorporated by reference herein in their entirety.

BACKGROUND

1. Field

The present invention relates to a touch sensor-antenna module and a display device including the same. More particularly, the present invention related to a touch sensor-antenna module including an antenna pattern and a touch sensor layer, and a display device including the same.

2. Description of the Related Art

As information technologies have been developed, a wireless communication technology such as Wi-Fi, Bluetooth, etc., is combined with a display device in, e.g., a smartphone. In this case, an antenna may be combined with the display device to provide a communication function.

Mobile communication technologies have been rapidly developed, an antenna capable of operating an ultra-high frequency communication, e.g., 3G to 5G communications is needed in the display device.

Further, a touch panel or a touch sensor capable of inputting a user's direction by selecting an instruction displayed on a screen with a finger or an inputting tool is also developed. The touch panel or the touch sensor may be combined with the display device so that display and information input functions may be implemented in one electronic device. For example, as disclosed in Korean Published Patent Application No. 2014-0092366, various image display devices combined with a touch screen panel including a touch sensor has been developed recently.

When the antenna and the touch sensor are present in one display device, desired gain property of the antenna may not be obtained due to a mutual signal interference and an impedance property for receiving a desired frequency may be disturbed. Further, repeated patterning processes for forming electrodes of fine dimensions included in the antenna and the touch sensor may cause a process complexity.

For example, Korean Published Patent Application No. 2003-0095557 discloses an antenna structure embedded in a mobile device, however fails to consider a compatibility with another electronic device such as the touch sensor.

SUMMARY

According to an aspect of the present invention, there is provided a touch sensor-antenna module having improved signaling efficiency and reliability.

According to an aspect of the present invention, there is provided a display device including a touch sensor-antenna module with improved signaling efficiency and reliability.

The above aspects of the present invention will be achieved by the following features or constructions:

(1) A touch sensor-antenna module, including: a substrate layer; a touch sensor electrode layer disposed on a central portion of an upper surface of the substrate layer; and antenna patterns disposed on a peripheral portion of the upper surface of the substrate layer at the same level as that of the touch sensor electrode layer.

(2) The touch sensor-antenna module according to the above (1), wherein the touch sensor electrode layer includes a plurality of sensing electrodes and traces electrically connected to the sensing electrodes.

(3) The touch sensor-antenna module according to the above (2), wherein the antennal patterns are arranged in a partial region of the peripheral portion except for a region for arranging the traces.

(4) The touch sensor-antenna module according to the above (2), wherein an active region is defined by a region for arranging the sensing electrodes, and at least one of the antenna patterns extends in the active region.

(5) The touch sensor-antenna module according to the above (4), wherein the sensing electrodes include first sensing electrodes arranged in a row direction and second sensing electrodes arranged in a column direction, wherein a first sensing unit is defined by a pair of the first sensing electrodes neighboring each other and a pair of the second sensing electrodes neighboring each other.

(6) The touch sensor-antenna module according to the above (5), wherein at least one sensing electrode is omitted from the first sensing unit located in a peripheral region of the active region to define a second sensing unit, wherein at least one of the antenna patterns is disposed in a space from which at least one sensing electrode is omitted in the second sensing unit.

(7) The touch sensor-antenna module according to the above (2), wherein each of the traces extends from each of the sensing electrodes, and the traces are disposed on the central portion of the substrate layer together with the sensing electrodes.

(8) The touch sensor-antenna module according to the above (2), wherein the antenna patterns and the sensing electrodes include the same mesh structure.

(9) The touch sensor-antenna module according to the above (1), wherein the antenna pattern includes a radiation electrode, a pad and a transmission line that electrically connects the radiation electrode and the pad.

(10) The touch sensor-antenna module according to the above (9), wherein the pad includes a signal pad and a ground pad that is spaced apart from the signal pad and electrically separated from the transmission line.

(11) The touch sensor-antenna module according to the above (10), wherein a pair of the ground pads are disposed to face each other with respect to the signal pad.

(12) The touch sensor-antenna module according to the above (1), wherein the substrate layer serves as a dielectric layer of the antenna patterns.

(13) The touch sensor-antenna module according to the above (1), further including a ground layer on a lower surface of the substrate layer.

(14) A display device including the touch sensor-antenna module according to any one of the above (1) to (13).

According to exemplary embodiments of the present invention, a touch sensor-antenna module may include a plurality of antenna patterns as an array so that radiation directivity and antenna gain may be improved.

The antenna patterns may be disposed at the same layer or the same level as that of electrode patterns in a touch sensor so that interference from the electrode patterns in the touch sensor may be avoided and the number of patterning processes may be reduced.

A transmission line included in the antenna pattern may be arranged to avoid a trace region included in the touch sensor. Thus, signal disturbance and impedance mismatching by the trace of the touch sensor may be prevented and radiation reliability of the antenna patterns may be improved.

DETAILED DESCRIPTION OF THE EMBODIMENTS

According to exemplary embodiments of the present invention, a touch sensor-antenna module that includes electrode patterns of a touch sensor and antenna patterns at the same layer or at the same level is provided. Further, a display device having improved signaling reliability and efficiency from the touch sensor-antenna module is also provided.

Hereinafter, the present invention will be described in detail with reference to the accompanying drawings. However, those skilled in the art will appreciate that such embodiments described with reference to the accompanying drawings are provided to further understand the spirit of the present invention and do not limit subject matters to be protected as disclosed in the detailed description and appended claims.

Figure 1:
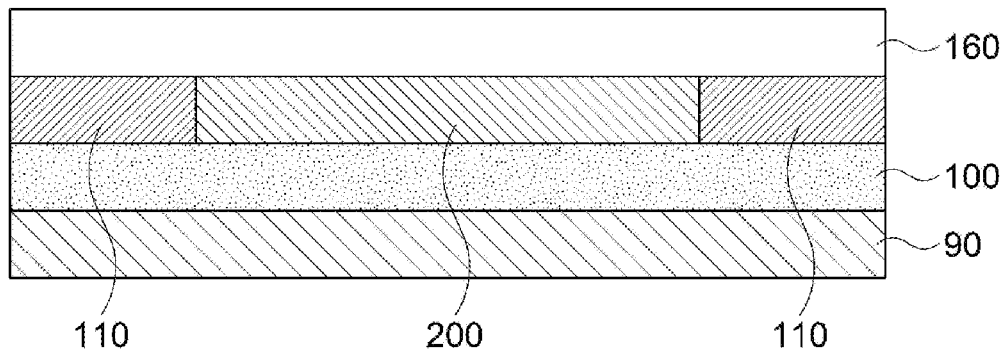
FIG. 1 is a schematic cross-sectional view illustrating touch sensor-antenna module in accordance with exemplary embodiments.

FIG. 1 is a schematic cross-sectional view illustrating touch sensor-antenna module in accordance with exemplary embodiments.

Referring to FIG. 1, the touch sensor-antenna module may include an antenna electrode layer 110 and a touch sensor electrode layer 200 disposed on a substrate layer 100.

The substrate layer 100 may include a film-type member used as a base layer for forming the touch sensor electrode layer 200 and the antenna electrode layer 110, or any object on which the touch sensor electrode layer 200 and the antenna electrode layer 110 are formed.

For example, the substrate layer 200 may include a substrate or a film material commonly used in a touch sensor, and may include, e.g., glass, a polymer and/or an inorganic insulation material. Examples of the polymer may include cyclo olefin polymer (COP), polyethylene terephthalate (PET), polyacrylate (PAR), polyether imide (PEI), polyethylene naphthalate (PEN), polyphenylene sulfide (PPS), polyallylate, polyimide (PI), cellulose acetate propionate (CAP), polyether sulfone (PES), cellulose triacetate (TAC), polycarbonate (PC), cyclo olefin copolymer (COC), polymethylmethacrylate (PMMA), etc. Examples of the inorganic insulation material may include silicon oxide, silicon nitride, silicon oxynitride, a metal oxide, etc.

A layer or a film member in an image display device to which the touch sensor is applied may also serve as the substrate layer 100. For example, an encapsulation layer or a passivation layer included in a display panel may serve as the substrate layer 100.

The substrate layer 100 may have a single-layered structure or may have a multi-layered structure including at least two layers.

The touch sensor electrode layer 200 may be disposed on a central portion of the substrate layer 100. The touch sensor electrode layer 200 may include sensing electrodes for implementing a touch sensing and traces electrically connected to the sensing electrodes. Elements and constructions of the sensing electrodes and the traces will be described in more detail with reference to FIGS. 3 to 5.

The antenna electrode layer 110 may be disposed on a peripheral portion of the substrate layer 100. The antenna electrode layer 110 may include a plurality of antenna patterns, and a structure of the antenna pattern will be described in more detail with reference to FIG. 2.

In exemplary embodiments, the substrate layer 100 may serve as a dielectric layer of the antenna electrode layer 110.

A capacitance or an inductance may be created in the substrate layer 100 so that a frequency range in which the antenna pattern included in the antenna electrode layer 110 is operated may be controlled. The antenna pattern may be applied to a communication device or a display device for high frequency or ultra-high frequency (for example, 3G, 4G, 5G or more) mobile communications.

In some embodiments, a dielectric constant of the substrate layer 100 may be in a range from about 1.5 to about 12. If the dielectric constant exceeds about 12, a driving frequency may be excessively decreased and a desired high-frequency radiation may not be implemented. Preferably, the dielectric constant of the substrate layer 100 may be in a range from about 2 to 12.

As illustrated in FIG. 1, the antenna electrode layer 110 and the touch sensor electrode layer 200 may be disposed at the same layer or at the same level, and may be disposed on an upper surface of the substrate layer 100

In some embodiments, a passivation layer 160 may be further formed on the antenna electrode layer 110 and the touch sensor electrode layer 200. The passivation layer 160 may include an inorganic insulation material such as silicon oxide, silicon nitride, etc., or an organic insulation material such as an acryl-based resin, a siloxane-based resin.

The touch sensor-antenna module may be fabricated as a film or a patch together with the substrate layer 100 and/or the passivation layer 160 to be easily applied to an image display device such as a smart phone as a thin film or patch.

In some embodiments, a ground layer 90 may be formed on a lower surface of the substrate layer 100. The ground layer 90 may include a metal or a transparent conductive oxide (e.g., ITO, IZO, etc.).

In an embodiment, a conductive member of the image display device to which the touch sensor-antenna module may be applied may serve as the ground layer 90. The conductive member may include a gate electrode of a thin film transistor (TFT), various wirings such as a scan line or a data line, various electrodes such as a pixel electrode, a common electrode, etc., included in a display panel.

Figure 2:
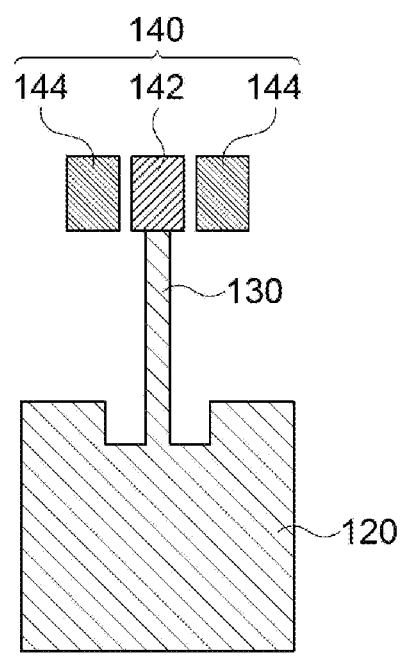
FIG. 2 is a schematic top planar view illustrating an antenna pattern in accordance with exemplary embodiments.

FIG. 2 is a schematic top planar view illustrating an antenna pattern in accordance with exemplary embodiments.

Referring to FIG. 2, each antenna pattern may include a radiation electrode 120, a transmission line 130 and a pad 140. The pad 140 may include a signal pad 142 and a ground pad 144.

The radiation pad 120 may have, e.g., a polygonal plate shape, and the transmission line 130 may extend from a central portion of one side of the radiation electrode 120 to be electrically connected to the signal pad 142. The transmission line 130 may be formed as a unitary member substantially integral with the radiation electrode 120.

In some embodiments, a pair of the ground pads 144 may be disposed with respect to the signal pad 142. The ground pads 144 may be electrically separated from the signal pad 142 and the transmission line 130. For example, the ground pad 144 may be electrically connected to the ground layer 90 illustrated in FIG. 1 so that noise may be discharged to an outside The radiation electrode 120, the transmission line 130 and/or the pad 140 may include silver (Ag), gold (Au), copper (Cu), aluminum (Al), platinum (Pt), palladium (Pd), chromium (Cr), titanium (Ti), tungsten (W), niobium (Nb), tantalum (Ta), vanadium (V), iron (Fe), manganese (Mn), cobalt (Co), nickel (Ni), tin (Sn), zinc (Zn), molybdenum (Mo), calcium (Ca) or an alloy thereof. These may be used alone or in a combination thereof.

In an embodiment, the radiation electrode 120 may include silver (Ag) or a silver alloy such as a silver-palladium-copper (APC) alloy. In an embodiment, the radiation electrode 120 may include copper (Cu) or a copper alloy in consideration of low resistance and pattern formation with a fine line width. For example, the radiation electrode 120 may include a copper-calcium (Cu—Ca) alloy.

In an embodiment, the radiation electrode 120 may be formed as a mesh structure including the metal. Accordingly, a transmittance of the antenna pattern may be increased, and the radiation electrode 120 may be prevented from being viewed by a user of a display device.

In some embodiments, the radiation electrode 120 may include a transparent conductive oxide such as indium tin oxide (ITO), indium zinc oxide (IZO), zinc oxide (ZnO), indium zinc tin oxide (IZTO), cadmium tin oxide (CTO), etc.

In some embodiments, the radiation electrode 120 may include a multi-layered structure including the transparent conductive oxide and the metal. For example, the radiation electrode 120 may have a triple-layered structure of a transparent conductive oxide layer-a metal layer-a transparent conductive oxide layer. In this case, a flexible property may be enhanced by the metal layer so that a resistance may be reduced and a signal transfer speed may be improved. Further, a resistance to corrosion and a transparency may be enhanced by the transparent conductive oxide layer.

Figure 3:
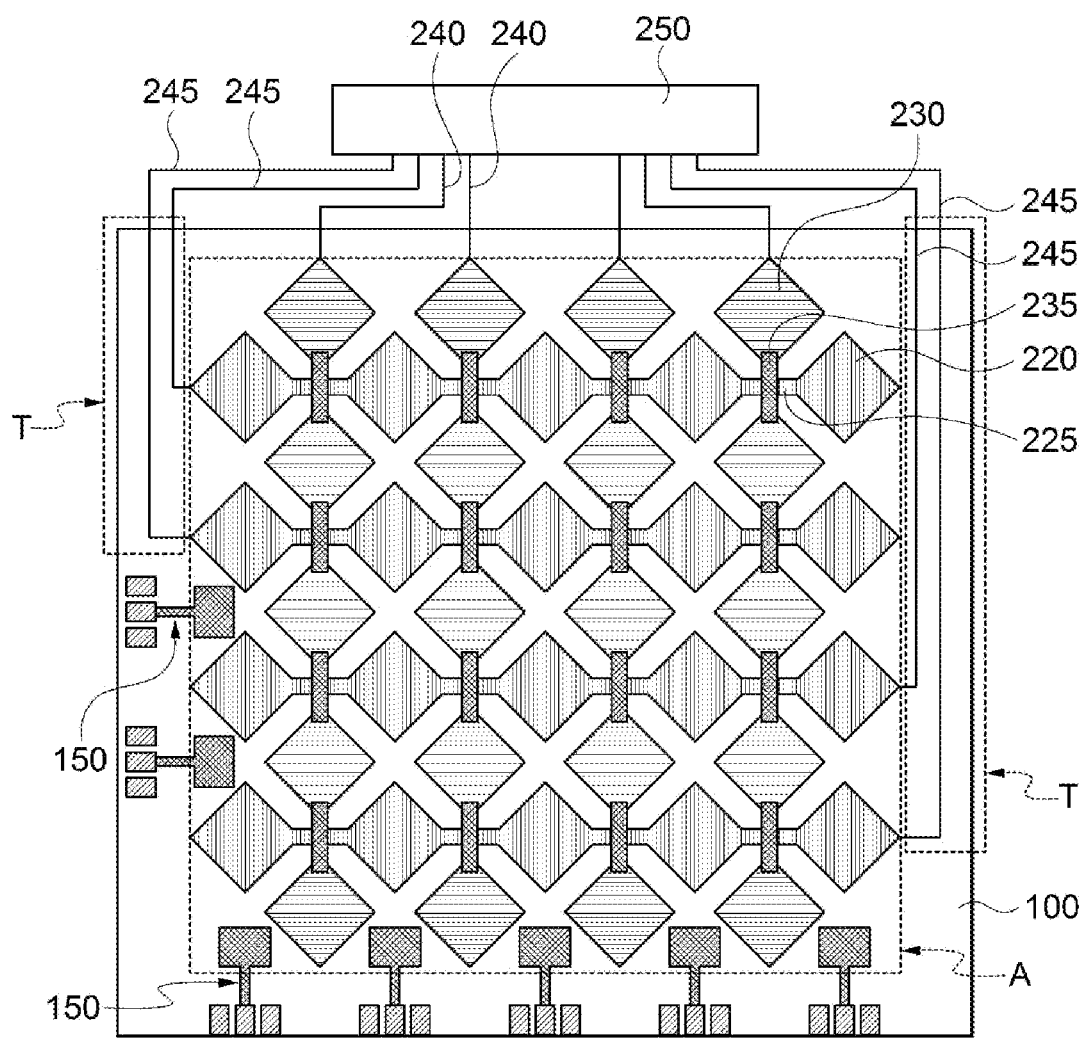
FIG. 3 is a schematic top planar view illustrating a touch sensor-antenna module in accordance with exemplary embodiments.

FIG. 3 is a schematic top planar view illustrating a touch sensor-antenna module in accordance with exemplary embodiments.

Referring to FIG. 3, the touch sensor-antenna module may include the touch sensor electrode layer 200 (see FIG. 1) on the substrate layer 100 and antenna patterns 150. As described above, the antenna patterns 150 may be arranged on the upper surface of the substrate layer 100 together with the touch sensor electrode layer 200.

The touch sensor electrode layer 200 may include sensing electrodes 220 and 230, and traces 240 and 245. The sensing electrodes 220 and 230 may include first sensing electrodes 220 and second sensing electrodes 230 in a mutual capacitance-type arrangement.

The traces 240 and 245 may include first traces 245 and second traces 240.

The sensing electrodes 220 and 230 may be arranged on an active region A for a touch sensing which may correspond to a central portion of the upper surface of the substrate layer 100. The traces 240 and 245 may be disposed on a peripheral portion of the upper surface of the substrate layer 100, and may extend from a first sensing electrode row and/or a second sensing electrode column as described below on a trace region T.

The first sensing electrodes 220 may be arranged along, e.g., a row direction parallel to the upper surface of the substrate layer 100 (e.g., an X-direction). Accordingly, a first sensing electrode row extending in the row direction may be formed by the first sensing electrodes 220. A plurality of the first sensing electrode rows may be arranged along a column direction (e.g., a Y-direction).

In some embodiments, the first sensing electrodes 220 neighboring in the row direction may be physically or electrically connected to each other by a connecting portion 225. For example, the connecting portion 225 may be formed as a substantially integral or unitary member with the first sensing electrodes 220 at the same level.

The second sensing electrodes 230 may be arranged along the column direction parallel to the upper surface of the substrate layer 100. In some embodiments, the second sensing electrodes 230 may include island-type unit electrodes physically spaced apart from each other. In this case, the second sensing electrodes 230 neighboring in the column direction may be electrically connected to each other by a bridge electrode 235.

Accordingly, a second sensing electrode column extending in the column direction may be formed by the second sensing electrodes 230. A plurality of the second sensing electrode columns may be arranged along the row direction.

For example, an insulation pattern (not illustrated) at least partially covering the connecting portion 225 may be formed, and the bridge electrode 235 may be formed on the insulation pattern to be in contact with or electrically connected to the second sensing electrodes 230 neighboring in the column direction.

Each sensing electrode 220 and 230 may have a rhombus shape as illustrated in FIG. 3. However, the shape of the sensing electrodes 220 and 230 may be properly modified in consideration of an electrode density, a circuit design, a sensitivity, etc.

For example, the sensing electrodes 220 and 230 and/or the bridge electrode 235 may include silver (Ag), gold (Au), copper (Cu), aluminum (Al), platinum (Pt), palladium (Pd), chromium (Cr), titanium (Ti), tungsten (W), niobium (Nb), tantalum (Ta), vanadium (V), iron (Fe), manganese (Mn), cobalt (Co), nickel (Ni), tin (Sn), zinc (Zn), molybdenum (Mo), calcium (Ca) or an alloy thereof (e.g., silver-palladium-copper (APC), copper-calcium (Cu—Ca)). These may be used alone or in a combination thereof.

The sensing electrodes 220 and 230 and/or the bridge electrode 235 may include a transparent conductive oxide such as indium tin oxide (ITO), indium zinc oxide (IZO), zinc oxide (ZnO), indium zinc tin oxide (IZTO), cadmium tin oxide (CTO), etc.

In some embodiments, the sensing electrodes 220 and 230 and/or the bridge electrode 235 may include a multi-layered structure including the transparent conductive oxide and the metal. For example, the sensing electrodes 220 and 230 and/or the bridge electrode 235 may have a triple-layered structure of a transparent conductive oxide layer-a metal layer-a transparent conductive oxide layer. In this case, a flexible property may be enhanced by the metal layer so that a resistance may be reduced and a signal transfer speed may be improved. Further, a resistance to corrosion and a transparency may be enhanced by the transparent conductive oxide layer.

In some embodiments, the sensing electrodes 220 and 230 may include a mesh structure. In an embodiment, the sensing electrodes 220 and 230 and the radiation electrode 120 of the antenna pattern 150 may include mesh structures having the same shape. Accordingly, visibility of the sensing electrodes 220 and 230 and the antenna pattern 150 may be reduced.

The first trace 245 may extend from each first sensing electrode row. For example, the first traces 245 may be dispersed on the trace region T at both lateral portions in the row direction of the substrate layer 200. The second trace 240 may extend from each second sensing electrode column.

The first and second traces 240 and 245 may be collected in, e.g., a pad region of the touch sensor layer to be electrically connected to a touch sensing integrated circuit (IC) chip 250. A physical signal detected by the sensing electrodes 220 and 230 may be converted into an electrical signal by the touch sensing IC chip 250 so that the touch sensing may be implemented.

The antenna pattern 150 may include the radiation electrode 120, the transmission line 130 and the pad 140 as illustrated in FIG. 2. A plurality of the antenna patterns 150 may be disposed at the same level as that of the sensing electrodes 220 and 230 and the traces 240 and 245.

In exemplary embodiments, the antenna patterns 150 may be arranged to avoid the trace region T among the peripheral portion of the substrate layer 100. In some embodiments, the antenna pattern 150 may be partially disposed on the active region A. For example, the radiation electrode 120 of the antenna pattern 150 may partially extend on the active region A without an overlap with the sensing electrodes 220 and 230.

According to exemplary embodiments as described above, the antenna patterns 150 may be arranged at the same level as that of the sensing electrodes 220 and 230 and the traces 240 and 245 so that the touch sensor electrode layer 200 and the antenna electrode layer 210 may be formed by substantially the same single patterning process.

Further, signal interference or capacitance disturbance caused when the antenna pattern 150 is disposed on the touch sensor electrode layer 200 or under the touch sensor electrode layer 200 may be prevented. For example, when the radiation electrode 120 is disposed at a different level from that of the sensing electrodes 220 and 230, signal shielding by the sensing electrodes 220 and 230 may be caused. However, according to exemplary embodiments, the antenna pattern 150 and the sensing electrodes 220 and 230 may be disposed at the same level so that mutual interference may be prevented, and a substantially independent operation of the antenna pattern 150 may be obtained.

The antenna patterns 150 may not be arranged in the trace region T so that signal interruption and impedance mismatching caused by the traces 240 and 245 may be also prevented.

A plurality of the antennal patterns 150 may be disposed as an array so that directivity and radiation intensity from the antenna electrode layer 110 may be improved. As illustrated in FIG. 3, a plurality of the antenna patterns 150 may be arranged along the row direction and the column direction only on the peripheral portion of the substrate layer 100 from which the traces 240 and 245 are excluded.

Figure 4:
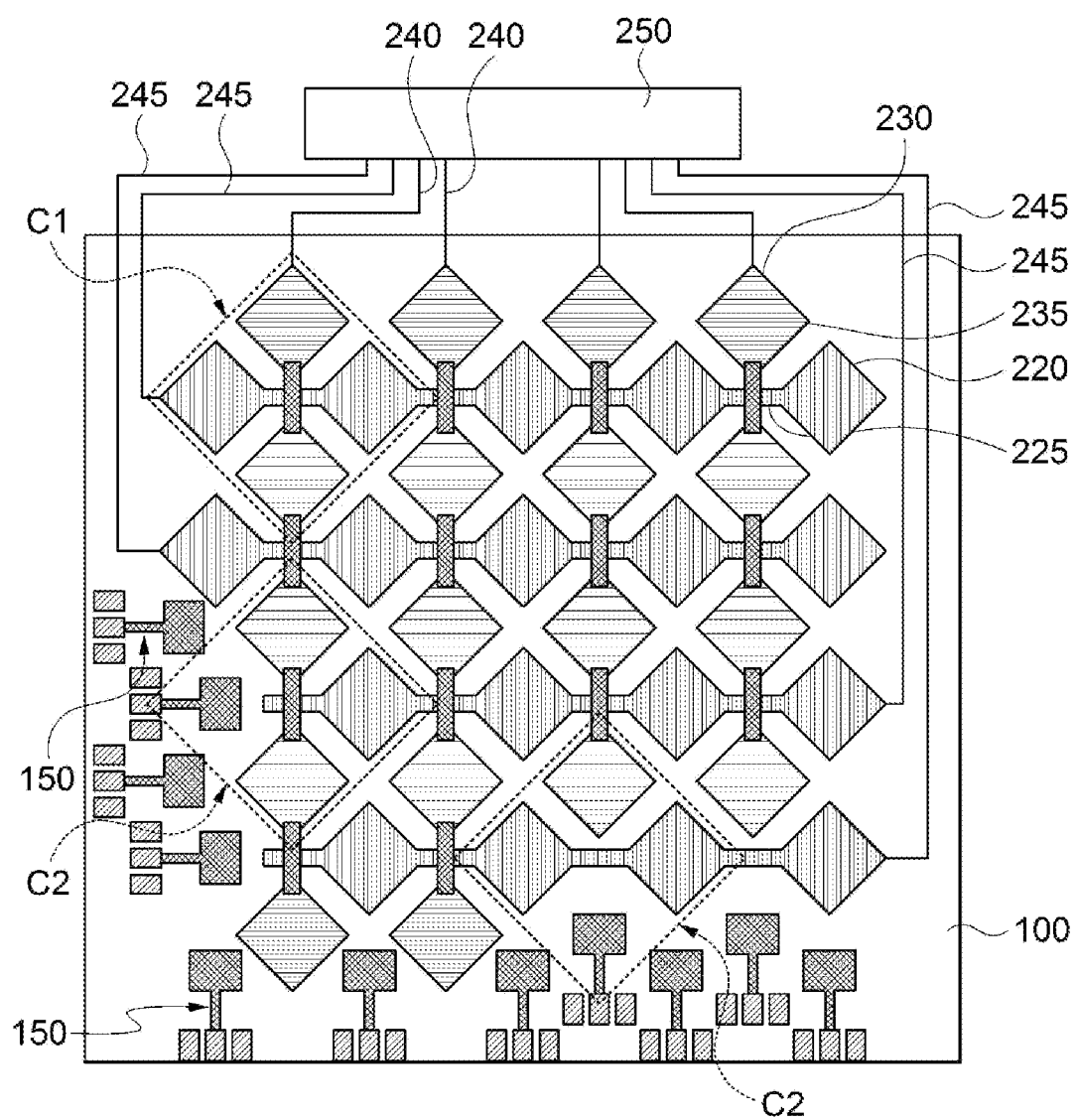
FIG. 4 is a schematic top planar view illustrating a touch sensor-antenna module in accordance with some exemplary embodiments.

FIG. 4 is a schematic top planar view illustrating a touch sensor-antenna module in accordance with some exemplary embodiments. Detailed descriptions on elements/structures substantially the same as or similar to those described with reference to FIG. 3 are omitted herein.

Referring to FIG. 4, a first sensing unit C1 including four sensing electrodes may be defined by a pair of the first sensing electrodes 220 neighboring each other and a pair of the second sensing electrodes 230 neighboring each other to implement a mutual capacitance-type touch sensing.

At least one sensing electrode may be omitted from some of the first sensing units C1 located at a peripheral portion of the active region A to define a second sensing unit C2. For example, as illustrated in FIG. 4, one first sensing electrode 220 or one second sensing electrode 230 may be omitted from the first sensing unit C1 to define the second sensing unit C2.

In exemplary embodiments, the antenna pattern 150 may be located at a space in the second sensing unit C2 from which the sensing electrode 220 and 230 may be omitted. Accordingly, a density of the antenna pattern 150 may be increased using a peripheral space from which the sensing electrode is omitted and at which a touch sensing frequency may be relatively small, so that improved radiation gain may be obtained.

Figure 5:
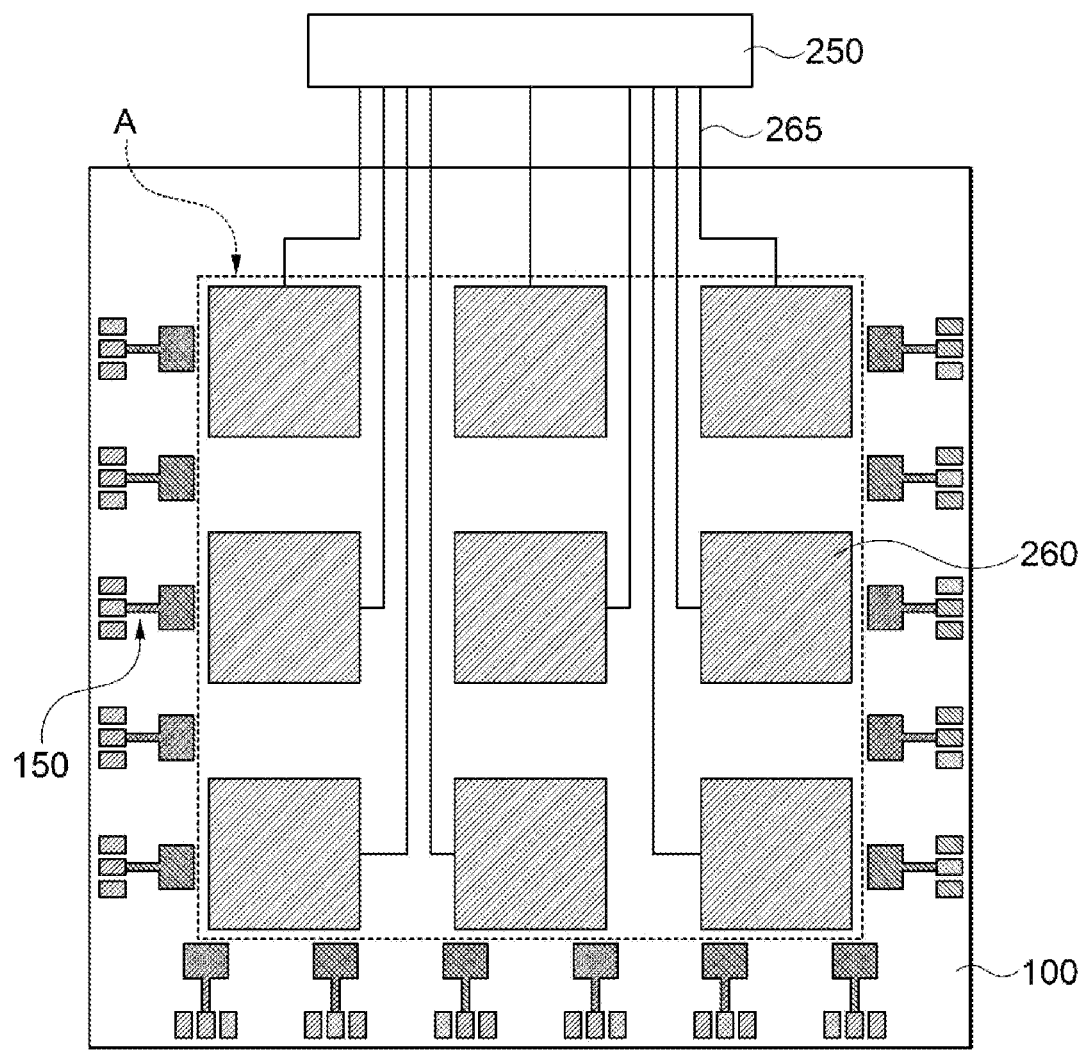
FIG. 5 is a schematic top planar view illustrating a touch sensor-antenna module in accordance with some exemplary embodiments.

FIG. 5 is a schematic top planar view illustrating a touch sensor-antenna module in accordance with some exemplary embodiments.

Referring to FIG. 5, sensing electrodes 260 and traces 265 of the touch sensing electrode layer 200 may be arranged for implementing a self-capacitance type touch sensing.

The touch sensor electrode layer 200 may include the sensing electrodes 260, each of which may have an independent island pattern shape on the active region A. Each sensing electrode 260 may serve as an independent sensing domain. The trace 265 may extend from each sensing electrode 260. Terminal ends of the traces 265 may be collected at an end portion of the substrate layer 100 to be electrically connected to the touch sensing IC chip 250.

In exemplary embodiments, the traces 265 may be disposed in the active region A together with the sensing electrodes 260. Thus, the trace region T of FIG. 3 which may be located at both lateral portions of the substrate layer 100 may be substantially removed or reduced.

A peripheral area of the substrate layer 100 capable of arranging the antenna patterns 150 may be increased by the removed or reduced trace region T. Thus, more enhanced radiation gain and radiation directivity may be obtained.

Figure 6:
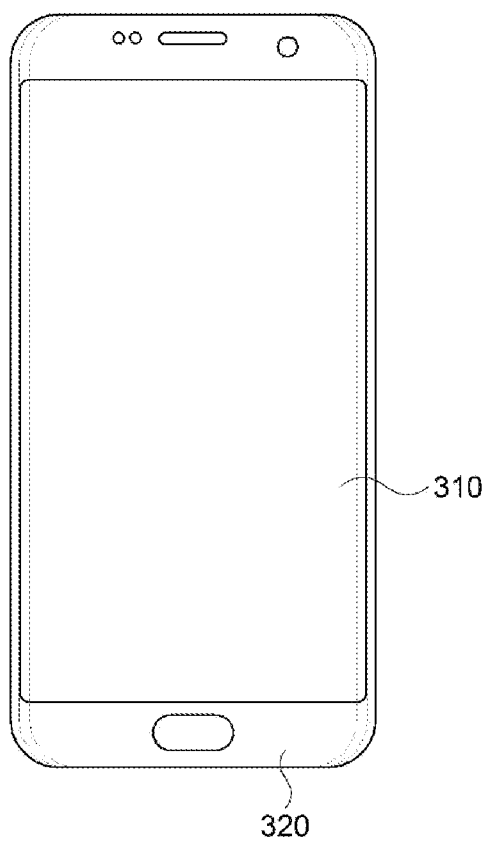
FIG. 6 is a schematic top planar view illustrating a display device in accordance with exemplary embodiments.

FIG. 6 is a schematic top planar view illustrating a display device in accordance with exemplary embodiments. For example, FIG. 6 illustrates an outer shape including a window of a display device.

Referring to FIG. 6, a display device 300 may include a display region 310 and a peripheral region 320. The peripheral region 320 may correspond to both end portions and/or both lateral portions around the display region 310. The peripheral region 320 may correspond to a light-shielding portion or a bezel portion of the display device.

In some embodiments, the touch sensor-antenna module may be disposed throughout the display region 310 and the peripheral region 320, and the sensing electrodes of the touch sensor electrode layer 200 may be arranged in the display region 310.

As illustrated in FIGS. 3 to 5, the antenna patterns 150 may be arranged along a peripheral portion of the touch sensor-antenna module and may be disposed in the peripheral region 320. For example, the pad 140 of the antenna pattern 150 and the traces 240 and 245 of the touch sensor electrode layer 200 may be disposed in the peripheral region 320.

Further, the touch sensing IC chip 250 and an antenna driving IC chip may be also disposed in the peripheral region 320. The pads 140 of the antenna pattern may be adjacent to the antenna driving IC chip in the peripheral region 320 so that a length of a signal transfer path may be decreased and a signal loss may be suppressed.

In some embodiments, at least a portion of the radiation electrode 120 included in the antenna pattern 150 may be disposed in the display region 310. In this case, the radiation electrode 120 may include the mesh structure so that visibility of the radiation electrode 120 may be reduced.

What is claimed is:

1. A touch sensor-antenna module, comprising:
   a substrate layer having an active region and a peripheral portion;
   a touch sensor electrode layer disposed on the active region of an upper surface of the substrate layer, the touch sensor electrode layer comprising sensing electrodes that comprises first sensing electrodes arranged in a row direction and second sensing electrodes arranged in a column direction;
   a connecting portion disposed on the active region of the upper surface of the substrate layer to electrically connect first sensing electrodes neighboring in the row direction to each other of the first sensing electrodes;
   a bridge electrode disposed on the active region of the upper surface of the substrate layer to electrically connect second sensing electrodes neighboring in the column direction to each other of the second sensing electrodes; and
   antenna patterns partially disposed on the active region of the upper surface of the substrate layer at a same level as that of the touch sensor electrode layer, and arranged to avoid the sensing electrodes, the connecting portion and the bridge electrode in a plan view.

2. The touch sensor-antenna module according to claim 1, wherein the touch sensor electrode layer includes traces electrically connected to the sensing electrodes.

3. The touch sensor-antenna module according to claim 2, wherein the antennal patterns are arranged in a partial region of the peripheral portion except for a region for arranging the traces.

4. The touch sensor-antenna module according to claim 1, wherein a first sensing unit is defined by a pair of the first sensing electrodes neighboring each other and a pair of the second sensing electrodes neighboring each other.

5. The touch sensor-antenna module according to claim 4, wherein at least one sensing electrode is omitted from the first sensing unit located in a peripheral region of the active region to define a second sensing unit,
   wherein at least one of the antenna patterns is disposed in a space from which at least one sensing electrode is omitted in the second sensing unit.

6. The touch sensor-antenna module according to claim 1, wherein each of the traces extends from each of the sensing electrodes, and the traces are disposed on the active region of the substrate layer together with the sensing electrodes.

7. The touch sensor-antenna module according to claim 1, wherein the antenna patterns and the sensing electrodes include a same mesh structure.

8. The touch sensor-antenna module according to claim 1, wherein the antenna pattern includes a radiation electrode, a pad and a transmission line that electrically connects the radiation electrode and the pad.

9. The touch sensor-antenna module according to claim 8, wherein the pad includes a signal pad and a ground pad that is spaced apart from the signal pad and electrically separated from the transmission line.

10. The touch sensor-antenna module according to claim 9, wherein a pair of the ground pads are disposed to face each other with respect to the signal pad.

11. The touch sensor-antenna module according to claim 1, wherein the substrate layer serves as a dielectric layer of the antenna patterns.

12. The touch sensor-antenna module according to claim 1, further comprising a ground layer on a lower surface of the substrate layer.

13. A display device including the touch sensor-antenna module according to claim 1.

* * * * *